(12) United States Patent
Logie et al.

(10) Patent No.: US 7,024,646 B2
(45) Date of Patent: Apr. 4, 2006

(54) ELECTROSTATIC DISCHARGE SIMULATION

(75) Inventors: Stewart Logie, Campbell, CA (US); Farrokh Kia Omid-Zohoor, Sunnyvale, CA (US); Nui Chong, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 59 days.

(21) Appl. No.: 10/769,174

(22) Filed: Jan. 29, 2004

(65) Prior Publication Data

US 2005/0172246 A1 Aug. 4, 2005

(51) Int. Cl.
*G06F 17/50* (2006.01)
(52) U.S. Cl. ............... 716/5; 716/4; 716/6; 703/14
(58) Field of Classification Search ........... 716/4–6; 703/14–16
See application file for complete search history.

(56) References Cited

U.S. PATENT DOCUMENTS

| 5,440,162 | A | * | 8/1995 | Worley et al. ............... 257/355 |
| 5,600,578 | A | * | 2/1997 | Fang et al. ................... 703/14 |
| 5,796,638 | A | * | 8/1998 | Kang et al. ..................... 716/5 |
| 6,493,850 | B1 | * | 12/2002 | Venugopal et al. ............. 716/4 |
| 6,539,531 | B1 | * | 3/2003 | Miller et al. .................. 716/15 |
| 6,553,542 | B1 | * | 4/2003 | Ramaswamy et al. ......... 716/2 |
| 2004/0187085 | A1 | * | 9/2004 | Sinha et al. .................... 716/4 |
| 2004/0243949 | A1 | * | 12/2004 | Wang et al. .................... 716/4 |

* cited by examiner

*Primary Examiner*—Matthew Smith
*Assistant Examiner*—Naum Levin
(74) *Attorney, Agent, or Firm*—MacPherson Kwok Chen & Heid LLP; Greg J. Michelson

(57) ABSTRACT

Systems and methods provide electrostatic discharge simulation techniques. For example, a method in accordance with an embodiment of the present invention provides a simulation of electrostatic discharge in integrated circuits. The method may allow for the design of protection circuits and simulating electrostatic discharge events concurrently with the design of the associated electrical circuit.

22 Claims, 11 Drawing Sheets

ELECTROSTATIC DISCHARGE SIMULATION

The present invention relates generally to electrical circuits and, more particularly, to the simulation of electrostatic discharge.

BACKGROUND

A modern integrated circuit may communicate by utilizing a number of different input and output signal standards. For example, an integrated circuit may transmit and receive information via one or more input/output circuits, which may be within the same input/output bank, at high speeds (e.g., 1 Gbps). The input/output circuit typically must also be designed to be protected from (e.g., have a certain immunity to damage from) electrostatic discharge.

In general, an input/output circuit design may be very complex and involve difficult compromises between performance (e.g., speed or data rate) and electrostatic discharge (ESD) protection. For example, a typical input/output circuit design process may involve adding standard, pre-approved ESD protection devices to the input/output circuit. The ESD protection device and the input/output circuit, for example, would then be implemented in silicon and tested to determine if the circuit meets design specifications.

After testing, it may be determined that the selected ESD protection device was not optimum for the desired application, such as for example being too large or in an incorrect configuration, and the process would have to be repeated, such as by selecting another ESD protection device or reconfiguring the current design for further testing. In general, this approach is time consuming and expensive with results that are often difficult to predict. As a result, there is a need for improved ESD design techniques.

SUMMARY

Systems and methods are disclosed herein to provide electrostatic discharge design and simulation techniques. For example, in accordance with an embodiment of the present invention, a method is disclosed for simulating electrostatic discharge in integrated circuits. The method may allow for the design of electrostatic discharge protection and simulating electrostatic discharge events concurrently with the design and simulation of the associated electrical circuit (e.g., input/output circuit). Consequently, a circuit designer may optimize a circuit design for electrostatic discharge protection and performance (e.g., speed) simultaneously or in a parallel fashion.

More specifically, in accordance with one embodiment of the present invention, a method of determining electrostatic discharge protection for a circuit includes entering the circuit into a circuit simulation program; representing a circuit element of the circuit in the circuit simulation program by its behavior under electrostatic discharge conditions; running the circuit simulation program to obtain simulation results, wherein the circuit simulation program provides an electrostatic discharge stimulus to the circuit; and comparing the simulation results to failure criteria for the circuit.

In accordance with another embodiment of the present invention, a computer readable medium storing a circuit simulation program includes symbols for representing a behavior of corresponding circuit elements under normal operating conditions; and symbols for representing a behavior of the corresponding circuit elements under electrostatic discharge conditions.

In accordance with another embodiment of the present invention, a method of testing a circuit for electrostatic discharge protection includes providing a circuit simulation program to simulate the circuit; and providing macros within the circuit simulation program which represent a behavior of corresponding circuit elements under electrostatic discharge conditions.

In accordance with another embodiment of the present invention, a method of generating circuit element macros for simulating electrostatic discharge behavior includes testing a physical circuit element to determine its behavior and failure criteria under electrostatic discharge conditions; and creating an associated macro for the physical circuit element representing the determined electrostatic discharge behavior, the macro suitable for use in a circuit simulation program.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
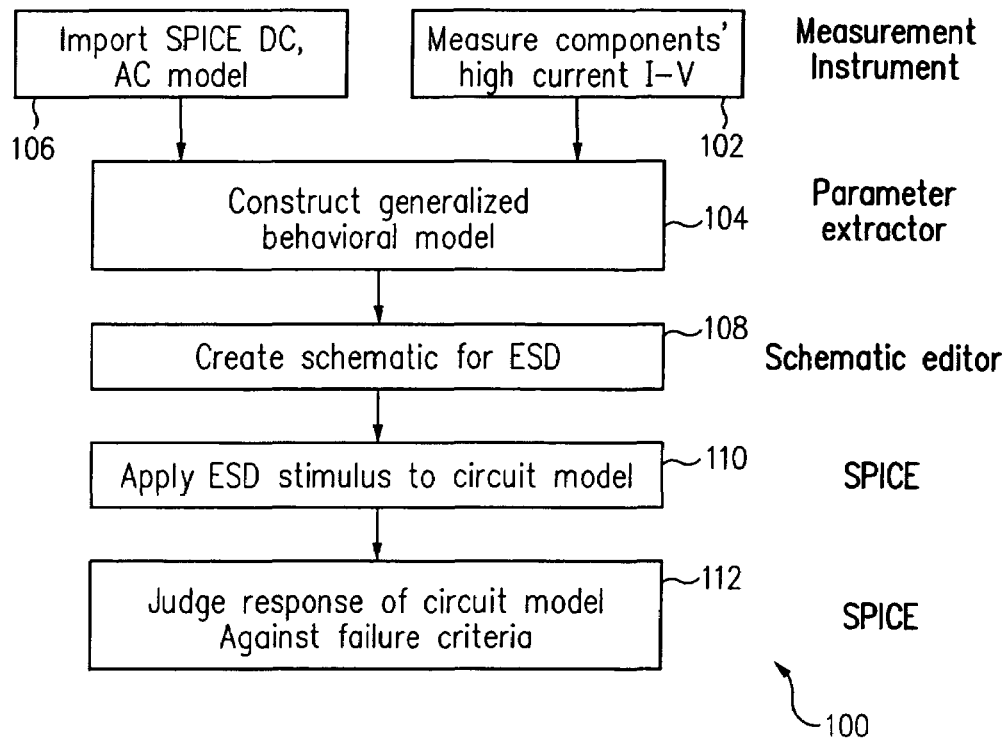
FIG. 1 shows a flowchart illustrating operations performed to simulate electrostatic discharge for a circuit in accordance with an embodiment of the present invention.

FIG. 1 shows a flowchart 100 illustrating operations performed to simulate electrostatic discharge (ESD) for a circuit in accordance with an embodiment of the present invention. In step 102, one or more physical electrical components are tested to measure and characterize their behavior in response to high voltages and currents. Various parameters associated with an electrical component being tested may be varied to allow the construction of a generalized behavioral model in step 104 of the electrical component. For example, various parameters of a particular type of transistor, such as its channel width or length may be varied over a desired range, to extract generalized parameters representing its behavior.

The generalized behavior model may be utilized to generate an associated macro for the electrical component to represent its behavior under high voltage and/or high current conditions and the macro incorporated into a circuit simulation program, such as for example SPICE (step 106). A circuit having electrostatic discharge protection circuitry may then be designed which utilizes one or more of the electrical components having associated macros and then entered into the circuit simulation program (step 108).

Various ESD stimuli may then be applied to the circuit being simulated within the circuit simulation program (step 110) and the circuit's response (based at least in part on the macros) compared to failure criteria (step 112) for electrical components within the circuit and/or to the circuit as a whole. A user may compare the circuit's response to the failure criteria or the failure criteria may be provided to the circuit simulation program to automatically compare the circuit's response to the failure criteria. The circuit simulation program may then run a large number of simulations under varying conditions and, for example, indicate any circuit failures to a user based on the provided failure criteria for the circuit.

Consequently, by varying the level of ESD stimulus and checking for destructive failure of the simulated circuit based on the failure criteria, the circuit's level of ESD protection may be determined. Furthermore, the circuit's performance of its intended function may also be determined by the circuit simulation program so that ESD protection and circuit performance are evaluated in a concurrent fashion through simulation.

One or more of the techniques disclosed herein may provide an improved approach to ESD protection design as compared to conventional approaches. For example, conventional approaches typically are experimental and iterative and require layout, mask generation, and silicon fabrication to test a design or implement a design change, which is generally a time-consuming and an expensive procedure. In contrast, one or more techniques disclosed herein employ simulation and synthesis to model ESD protection and circuit performance, which may provide a less expensive alternative and provide feedback quickly regarding ESD behavior and/or circuit performance.

Figure 2:
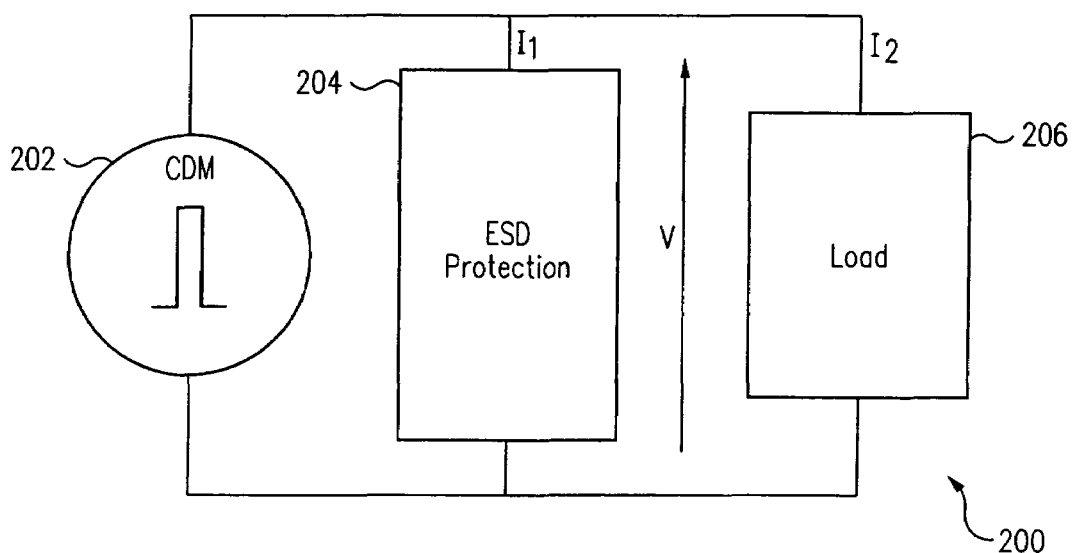
FIG. 2 shows a block diagram illustrating a representative circuit for simulating electrostatic discharge in accordance with an embodiment of the present invention.

FIG. 2 shows a block diagram illustrating an exemplary circuit 200 for simulating electrostatic discharge in accordance with an embodiment of the present invention. Circuit 200 includes an ESD protection circuit 204 and a load 206. ESD protection circuit 204 may represent any type of circuit or circuit element (e.g., a diode, a transistor, or a ballast resistor) for providing ESD protection for load 206. Load 206 represents a circuit or circuit element (e.g., a transistor, a resistor, a capacitor, an inductor, or wires) which is designed to perform the function desired for circuit 200 and which may require ESD protection.

Circuit 200 may be simulated in a circuit simulation program (e.g., SPICE) and one or more various types of ESD stimuli 202 applied to ESD protection circuit 204 and load 206 to measure simulated current and voltage levels. ESD stimuli 202 may represent, for example, a charge device model (CDM) or a human body model (HBM) ESD standard.

The current and voltage levels may be checked at various points (nodes) within circuit 200 to determine the maximum current and voltage levels. For example, the current through ESD protection circuit 204 (labeled $I_1$) and load 206 (labeled $I_2$) may be checked along with the voltage (V) across ESD protection circuit 204 and load 206 against maximum allowable currents and voltages. Consequently, ESD protection for a circuit may be determined through simulation in a similar fashion as circuit performance is determined through simulation.

By testing physical circuit elements to measure their behavior under ESD conditions and creating macros to represent their behavior in a circuit simulation program, the circuit simulation program, such as SPICE, can provide an ESD simulation model for high currents and/or voltages (i.e., an ESD event) in addition to its existing direct current (DC) and alternating current (AC) simulation models. In general, one circuit element may be simulated or some portion of a circuit up to an entire integrated circuit may be simulated.

For example, when entering a portion of an integrated circuit into the SPICE circuit simulation program (although the SPICE simulation program is referenced herein, it should be understood that the techniques disclosed herein are generally applicable to other types of circuit simulation programs), the simulated circuit may include a pad (e.g., one or more input/output pads), devices (e.g., circuit elements) connected to the pad, and devices located one level of circuitry downstream from the devices connected to the pad. The simulated circuit would also include any ESD protection devices and supply clamps associated with the simulated circuit. Various other circuitry or expected parasitic circuit elements (e.g., estimated power supply capacitances) associated with the circuit may also be included as part of the simulated circuit.

The simulated circuit elements of the simulated circuit would be identified by the standard SPICE symbols. During ESD simulation, additional sub-circuits (corresponding to the macros incorporated into SPICE to represent the general behavior of the corresponding circuit elements based on testing under ESD conditions and developed as discussed in reference to FIG. 1) are automatically added in parallel with each device in the netlist. Alternatively, the simulated circuit elements of the simulated circuit would be identified by the standard SPICE symbols and also identified in parallel by the ESD model symbols (or high current symbols) corresponding to the macros developed as discussed in reference to FIG. 1 (i.e., the macros incorporated into SPICE to represent the general behavior of the corresponding circuit elements based on testing under ESD conditions). For example, a MOS transistor in the SPICE simulation would be identified with a conventional MOS symbol along with an ESD symbol to represent its low current and high current behavior, respectively.

The simulated circuit may then be evaluated under various ESD conditions. For example, ESD stimulus may be applied to the simulated circuit and one or more points of interest of the simulated circuit, such as node voltages and/or branch currents, may be monitored and compared to maximum allowable peak voltages and currents. The maximum allowable peak voltages and currents for a circuit element may be determined through testing (e.g., step 102 of FIG. 1) and/or based on manufacturer specifications for the circuit element (e.g., to determine the failure criteria as discussed in step 112 of FIG. 1).

Figure 3:
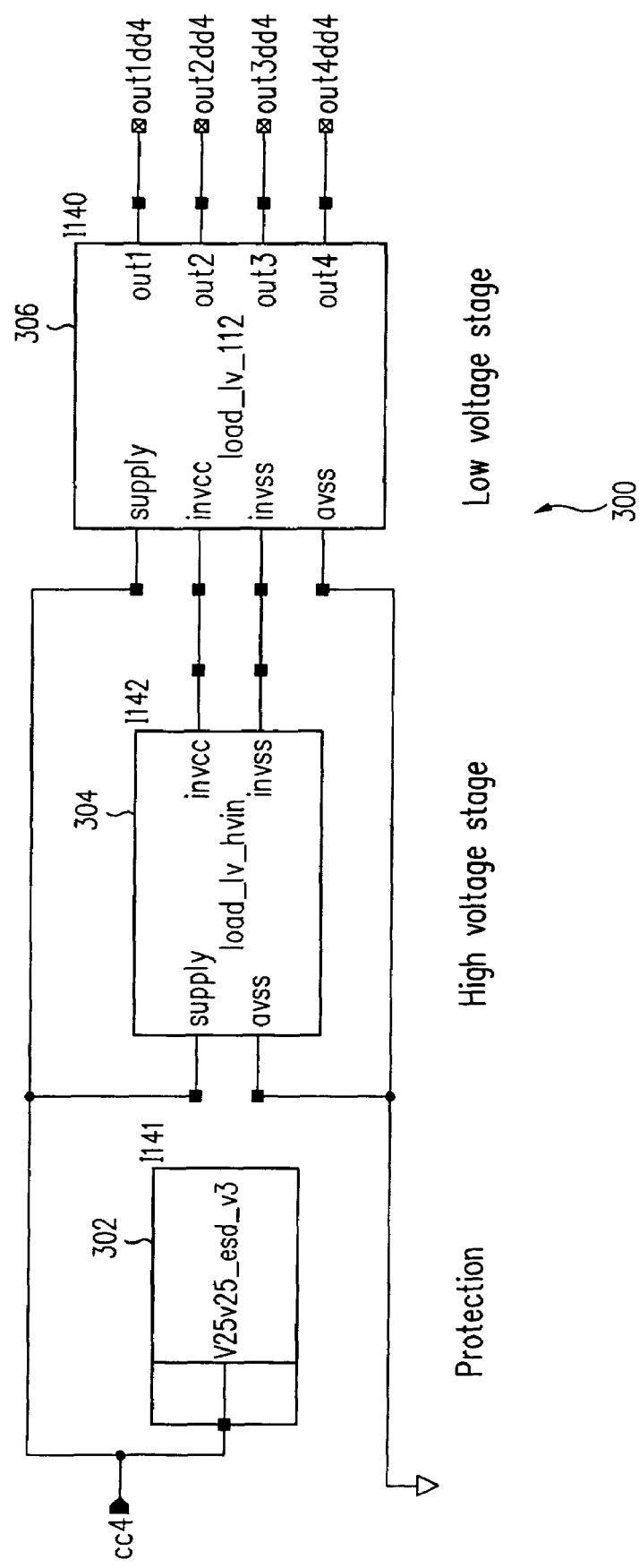
FIG. 3 shows a block diagram illustrating a representative circuit for simulating electrostatic discharge in accordance with an embodiment of the present invention.

FIG. 3 shows a block diagram illustrating an exemplary circuit 300 for simulating electrostatic discharge in accordance with an embodiment of the present invention. Circuit 300 includes a protection circuit 302, a high voltage stage circuit 304, and a low voltage stage circuit 306. Protection circuit 302 may correspond to ESD protection circuit 204 (FIG. 2) and high voltage stage circuit 304 and low voltage stage circuit 306 may correspond to load 206 (FIG. 2).

Figure 4:
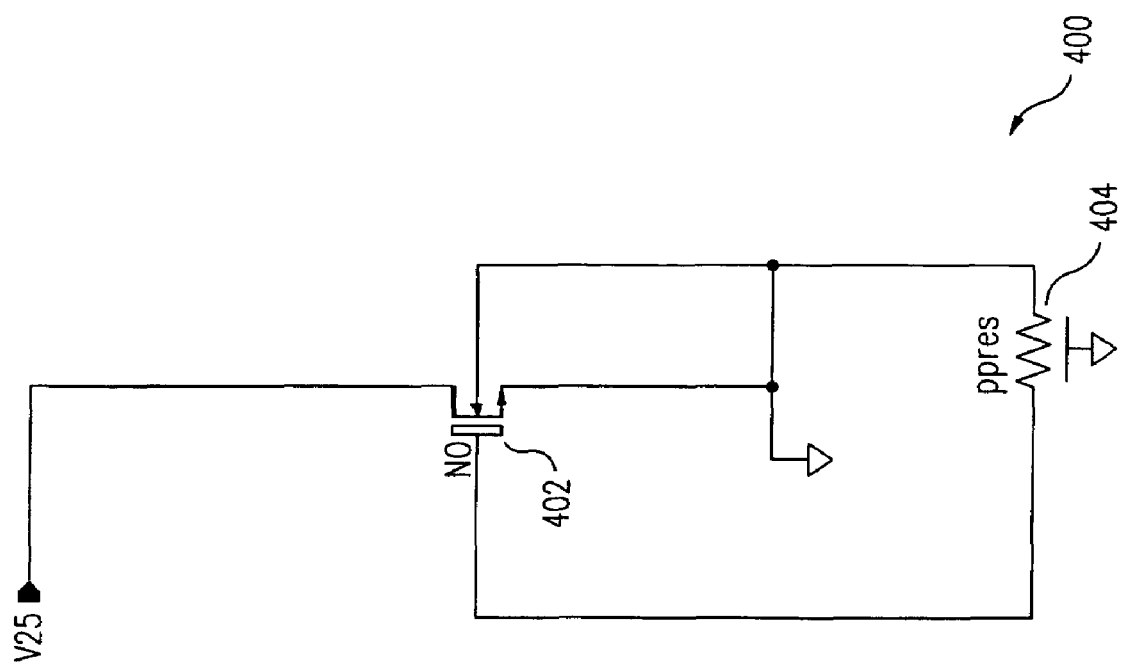
FIG. 4 shows an exemplary circuit implementation for a portion of FIG. 3 in accordance with an embodiment of the present invention.

FIG. 4 shows a circuit 400, which is an exemplary circuit implementation for protection circuit 302 of FIG. 3 in accordance with an embodiment of the present invention. Circuit 400 includes a transistor 402 and a resistor 404. As an example, transistor 402 may be represented in the SPICE circuit simulation program by its standard MOS transistor symbol and also by its ESD model symbol so that SPICE may simulate its low current and/or high current behavior, respectively.

Figure 5:
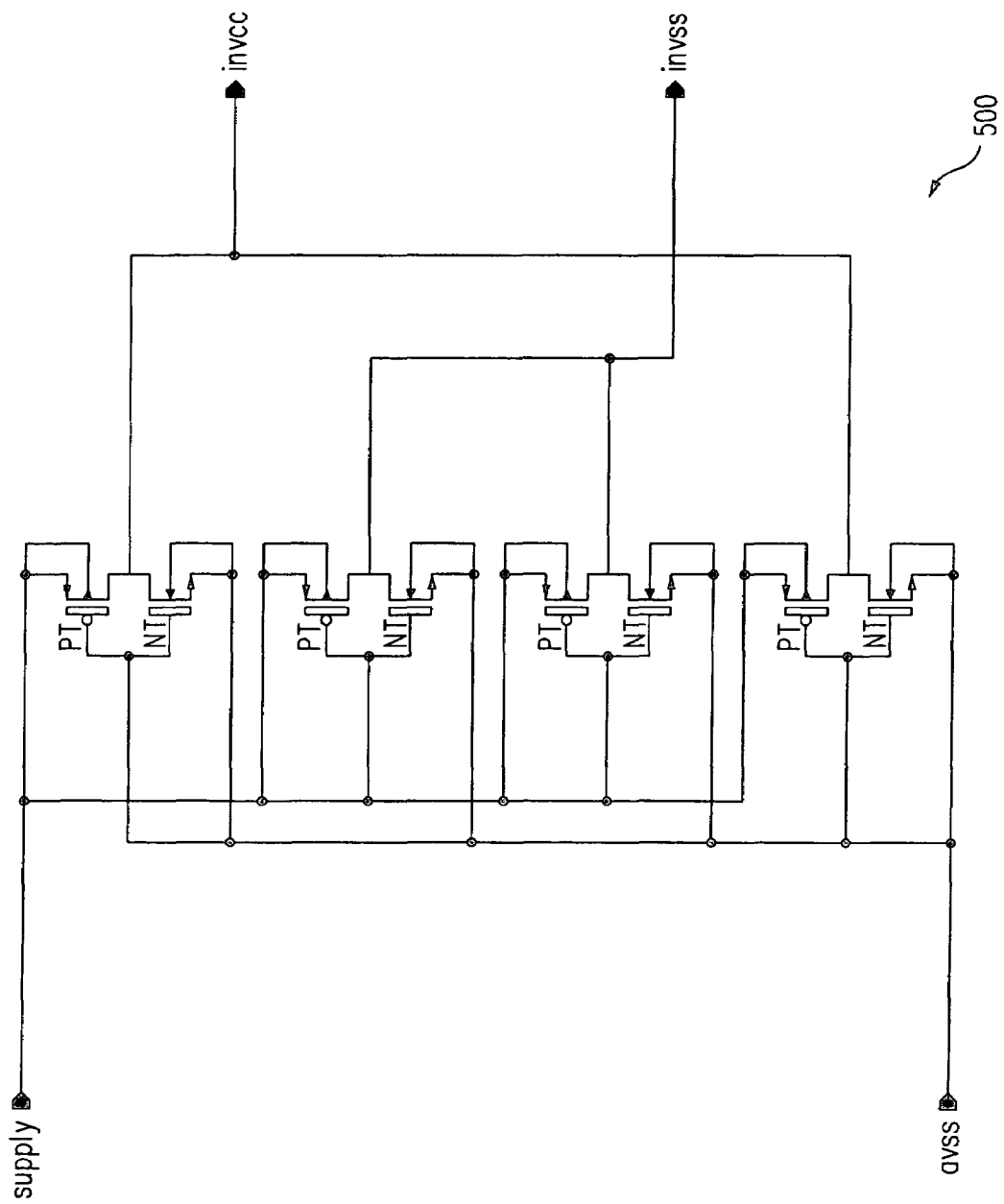
FIG. 5 shows an exemplary circuit implementation for a portion of FIG. 3 in accordance with an embodiment of the present invention.
Figure 6:
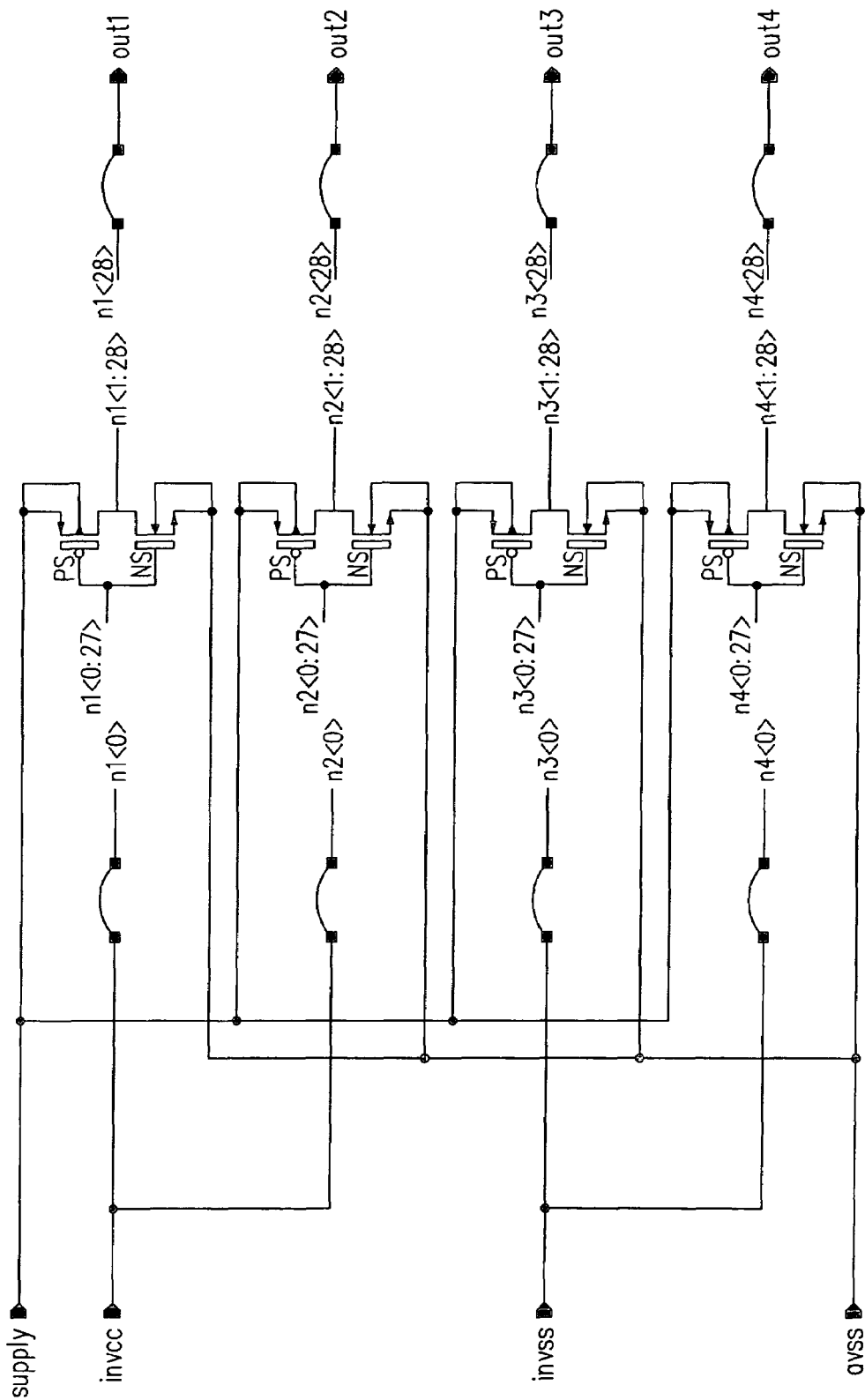
FIG. 6 shows an exemplary circuit implementation for a portion of FIG. 3 in accordance with an embodiment of the present invention.

FIG. 5 shows a circuit 500, which is an exemplary circuit implementation for high voltage stage circuit 304 of FIG. 3, and FIG. 6 shows a circuit 600, which is an exemplary circuit implementation for low voltage stage circuit 306 of FIG. 3, in accordance with an embodiment of the present invention. Circuits 500 and 600 include a number of circuit elements (e.g., transistors), which may be represented by their standard SPICE symbols and also, if desired, by their ESD model symbols to provide standard simulation results as well as ESD simulation results, respectively.

Figure 7:
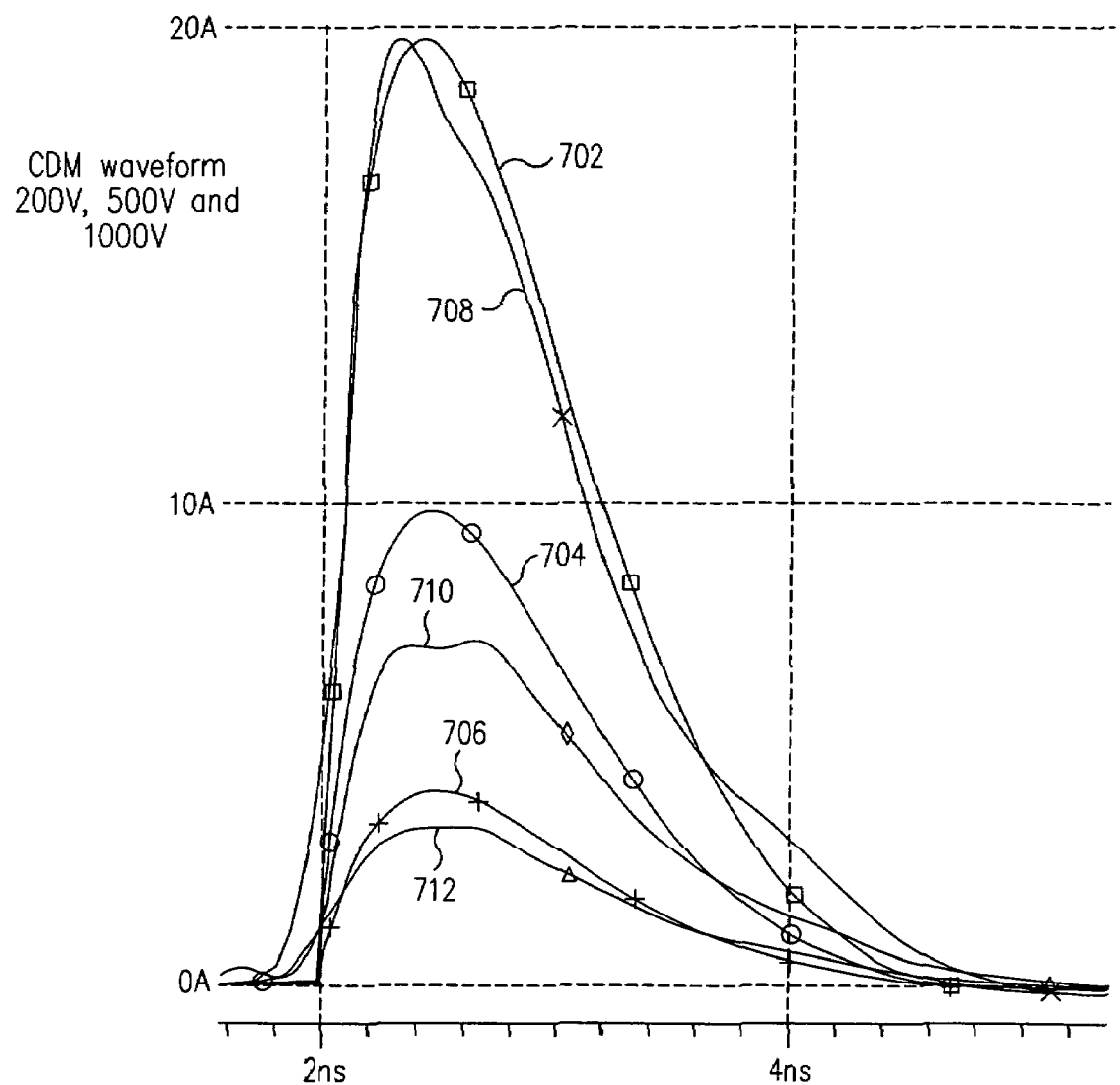
FIG. 7 shows an exemplary graph illustrating a simulation result for the circuit of FIG. 3 in accordance with an embodiment of the present invention.
Figure 8:
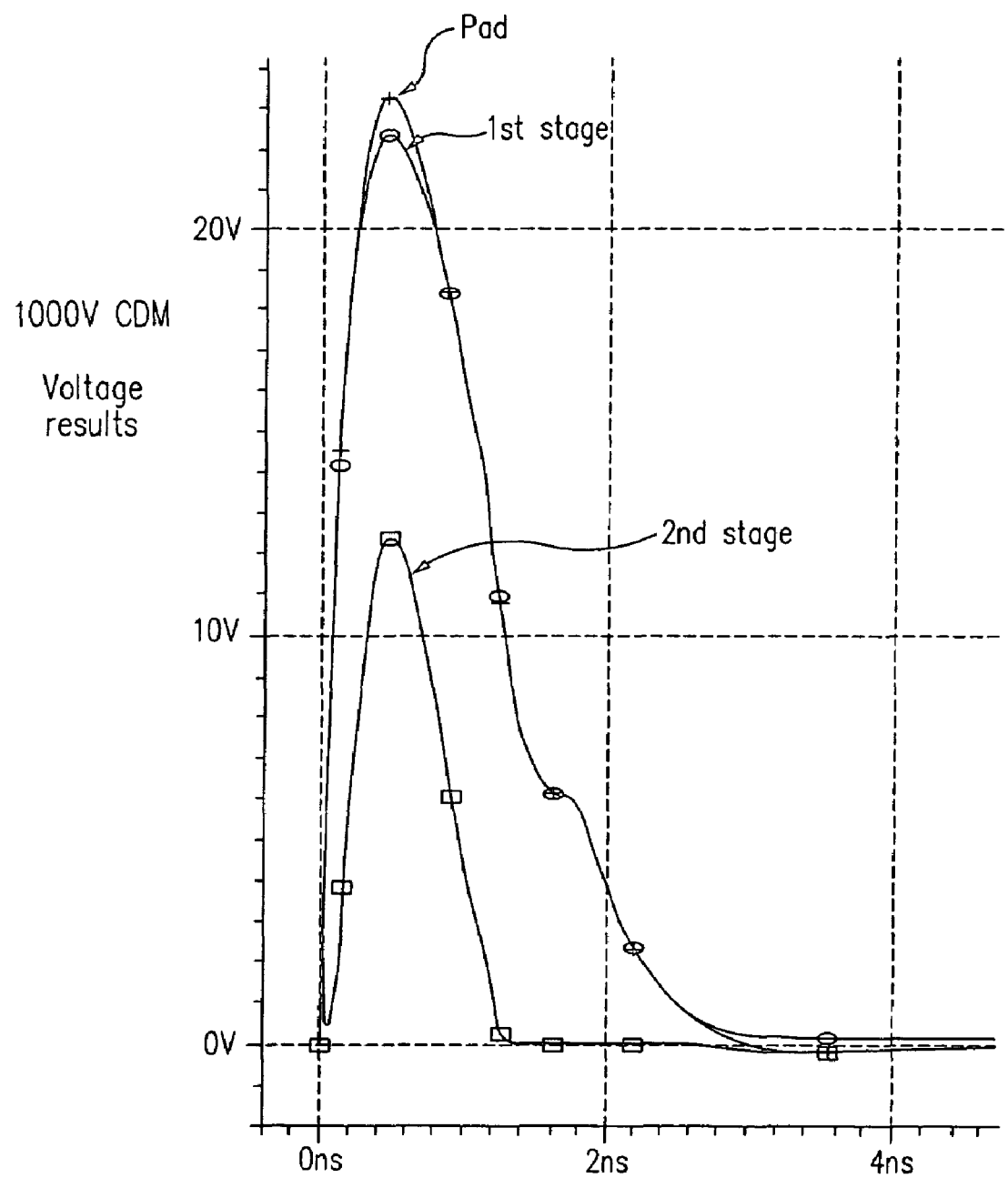
FIG. 8 shows an exemplary graph illustrating a simulation result for the circuit of FIG. 3 in accordance with an embodiment of the present invention.
Figure 9:
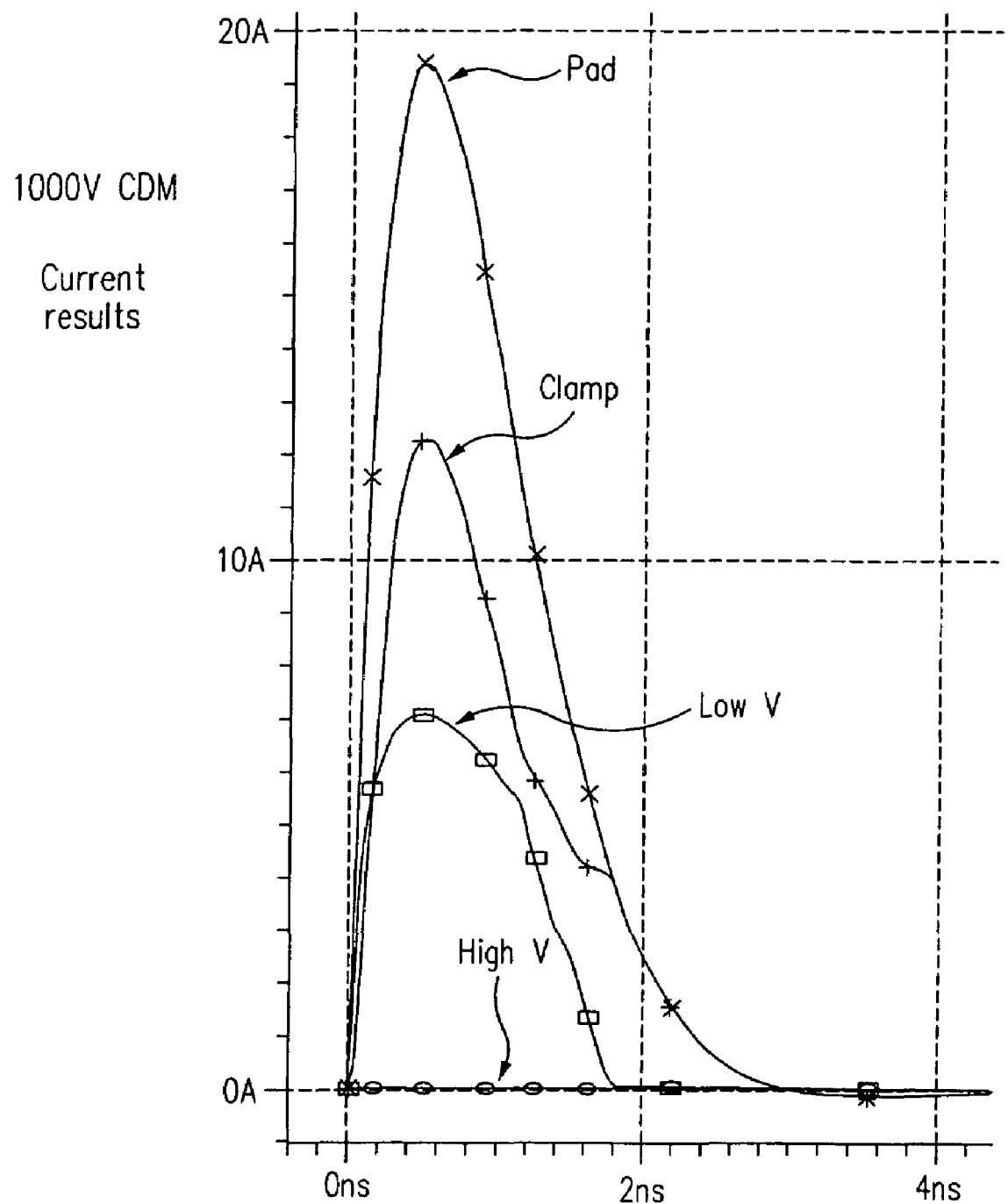
FIG. 9 shows an exemplary graph illustrating a simulation result for the circuit of FIG. 3 in accordance with an embodiment of the present invention.

FIGS. 7–9 show graphs illustrating exemplary simulation results for circuit 300 of FIG. 3 in accordance with an embodiment of the present invention. FIG. 7 shows input current versus time plots for waveforms 702 through 712 resulting from the application of a CDM-type of ESD stimulus at 200, 500, and 1000 volts. Waveforms 702, 704, and 706 represent the simulation results for circuit 300 and waveforms 708, 710, and 712 represent the corresponding measured test results of the physical embodiment of circuit 300. Waveforms 702 and 708, 704 and 710, and 706 and 712 correspond to ESD stimulus of 1000, 500, and 200 volts, respectively. As illustrated in FIG. 7, the simulated results compare favorably with the actual measured results.

FIG. 8 shows simulated results of voltage versus time based on a CDM ESD stimulus of 1000 volts. Waveforms are plotted corresponding to simulation voltage measurements at an input pad (labeled Pad), high voltage stage circuit 304 (labeled $1^{st}$ stage), and low voltage stage circuit 306 (labeled $2^{nd}$ stage) of circuit 300.

FIG. 9 shows simulated results of current versus time for the CDM ESD stimulus of 1000 volts. Waveforms are plotted corresponding to simulation current measurements at an input pad (labeled Pad), protection circuit 302 (labeled Clamp), high voltage stage circuit 304 (labeled High V), and low voltage stage circuit 306 (labeled Low V) of circuit 300.

Figure 10:
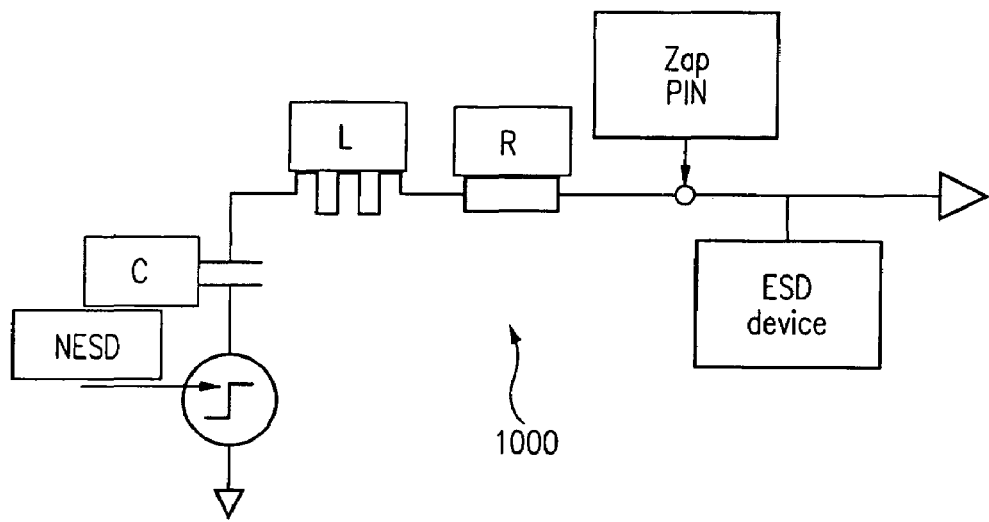
FIG. 10 shows an exemplary circuit for providing an electrostatic discharge stimulus in accordance with an embodiment of the present invention.

FIG. 10 shows an exemplary circuit 1000 for providing a CDM ESD stimulus in accordance with an embodiment of the present invention. Circuit 1000 includes a capacitor (C), an inductor (L), and a resistor (R), with exemplary values of 23.45 pF, 10.44 nH, and 34.98 ohms, respectively. The values for C, L, and R may be package and tester dependent. A square wave may be applied at an input node (labeled NESD) ranging in duration, for example, from 1 picosecond to 10 nanoseconds (e.g., in SPICE set TRAN 1 p 10 n). The ESD testing may be performed in accordance with the desired standard, such as for example the CDM standard using a two-node method with one node at the stress voltage and all other nodes at zero volts (e.g., set NESD at stress voltage and all other nodes at zero volts), although the polarities may be reversed as known by one skilled in the art.

Figure 11:
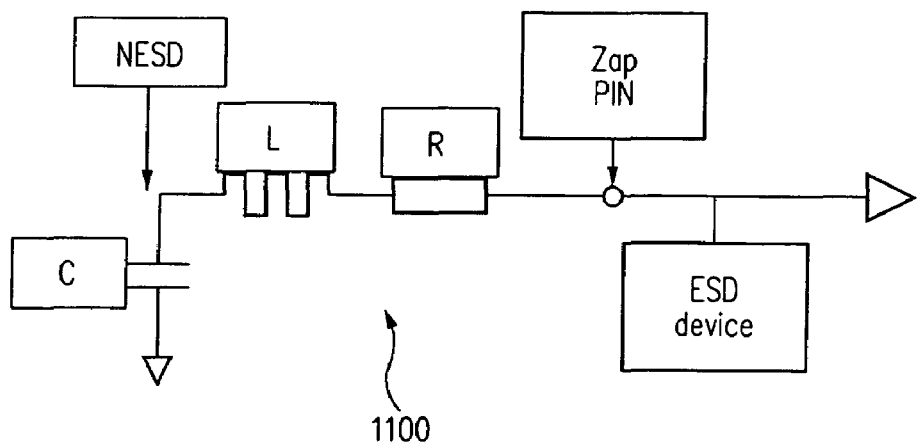
FIG. 11 shows an exemplary circuit for providing an electrostatic discharge stimulus in accordance with an embodiment of the present invention.

FIG. 11 shows an exemplary circuit 1100 for providing a HBM ESD stimulus in accordance with an embodiment of the present invention. Exemplary values for the capacitor (C), the inductor (L), and the resistor (R) are 100 pF, 7.5 pH, and 1500 ohms, respectively. The node (labeled NESD) receives the stress voltage, which may range in duration, for example, from 10 picoseconds to 200 nanoseconds (e.g., in SPICE set TRAN 10 p 200 n).

As discussed above (e.g., in reference to step 102 of FIG. 1), physical electrical components are tested to measure and characterize their behavior in response to high voltages and currents (e.g., to ESD-like events). In accordance with an embodiment of the present invention, the testing of the electrical components may be performed via transmission line pulse techniques. For example, a transmission line pulse test method may include charging a coaxial cable and then discharging the coaxial cable into a test device (i.e., an electrical component under test) via a relay. The current and voltage levels of the test device are monitored, for example, via probes of a fast scope, which allows measurement of the high currents and voltages while possibly avoiding sample destruction (i.e., destruction of the test device due to the testing). Furthermore, the test techniques are applicable to two terminal devices (e.g., a diode) and also applicable to devices having, for example, three terminals or more (e.g., a transistor).

Figure 12:
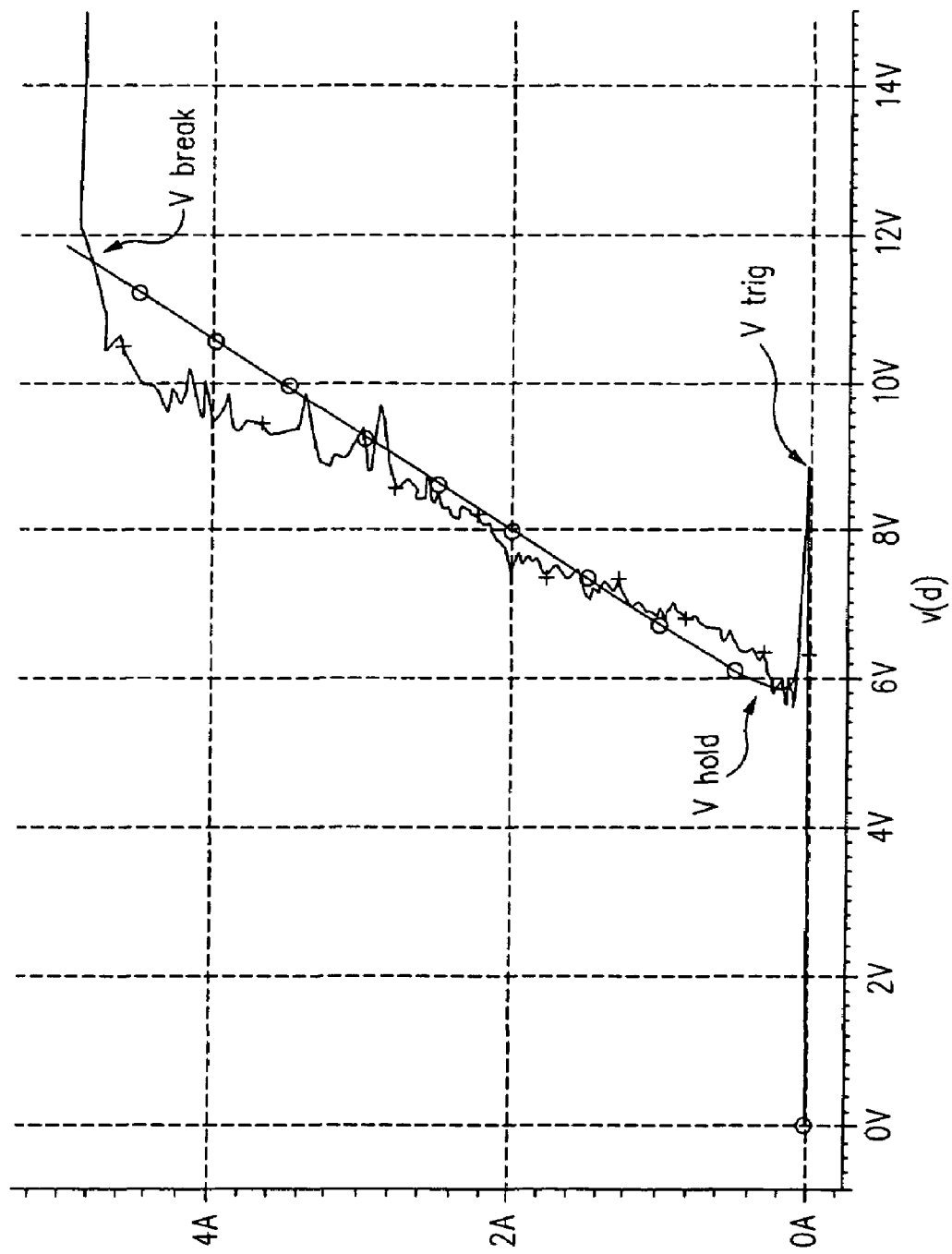
FIG. 12 shows an exemplary plot of current versus voltage for an electrical component in accordance with an embodiment of the present invention.

The amount of charge applied to the test device may be varied (e.g., gradually increased) and, for example, a current versus voltage plot generated for the test device based on test measurements. For example, FIG. 12 shows an exemplary plot of current versus voltage for an electrical component in accordance with an embodiment of the present invention. The plot may, for example, represent transmission line pulse test results for an N-channel metal oxide semiconductor (MOS) transistor from drain-to-source terminal with its gate terminal grounded and coupled to the source terminal.

A point on the plot labeled V break indicates a failure point of the electrical component, while the plot between V break and a point labeled V hold represents the general behavior (e.g., resistance) of the electrical component under ESD conditions. By utilizing test data, such as plotted in FIG. 12, generalized parameters may be developed regarding the electrical component to develop an associated macro representing its behavior, which is incorporated into a circuit simulation program (as described in reference to FIG. 1).

As an example, Table 1 illustrates a table of failure criteria for various types of exemplary devices (e.g., various types of transistors and diodes). The values for IT2/W and ITR/W represent exemplary failure currents, normalized and based on width, for these devices, with ITR/W representing the failure current in the direction opposite that of IT2/W. The value for Vtrig is the initial voltage measurement (e.g., as illustrated in FIG. 12), while HBM and CDM provide the maximum allowable voltages (e.g., corresponding approximately to V break illustrated in FIG. 12) when the HBM or CDM ESD stimulus is applied, respectively.

The results of the circuit simulation program may be compared to failure criteria listed, for example, in Table 1 as described for steps 110 and 112 of FIG. 1 to determine if the simulated circuit provides the desired ESD protection. For example, by varying the level of ESD stimulus and checking for destructive failure of the simulated circuit based on the failure criteria, the circuit's level of ESD protection may be determined.

TABLE 1

| DEVICE | IT2/W (mA/μm) | ITR/W (mA/μm) | Vtrig (V) | HBM \|Vgmax\| | CDM \|Vgmax\| |
|---|---|---|---|---|---|
| NMOS transistor (NO std spacing) | 6.67 | −6.67 | 8.9 | 13.5 | 18.9 |
| NMOS transistor (NO 0.5) | 8.47 | −6.67 | 8.9 | 13.5 | 18.9 |
| NMOS transistor (NIX) 2.5 V | 8.47 | −5.28 | 8.9 | 13.5 | 18.9 |
| PMOS transistor (PI) 2.5 V | −3.2 | 3.7 | 8.2 | 13.5 | 18.9 |
| NMOS transistor (NI) 2.5 V | 6.1 | −13.2 | 8.5 | 13.5 | 18.9 |
| PMOS transistor (PT) 2.5 V | −9 | 13.5 | 8.0 | 13.5 | 18.9 |
| NMOS transistor (NT) 2.5 V | 17.8 | −47.5 | 8.5 | 13.5 | 18.9 |
| PMOS transistor (PS) 1.2 V | −10.5 | 10 | 5.9 | 6 | 8.4 |
| NMOS transistor (NS) 1.2 V | 47 | −48 | 4.4 | 6 | 8.4 |
| PMOS transistor (PE) 1.2 V | −14 | 21 | 4.3 | 6 | 8.4 |
| NMOS transistor (NE) 1.2 V | 19.8 | −38.5 | 3.7 | 6 | 8.4 |
| Trench isolated diode p+/n− | 46.2 | −3.56 | | | |
| Trench isolated diode n+/p− | 47.0 | −3.26 | | | |
| Polybound diode p+/n− | 43.4 | −4.1 | | | |
| Polybound diode n+/p− | 43.4 | −4.1 | | | |
| Back-to-back | 43.4 | −44.4 | | | |
| Stack diode | 46.0 | −45.5 | | | |

As an example, in accordance with an embodiment of the present invention, Table 2 illustrates an exemplary SPICE macro for an NMOS transistor, which provides the SPICE simulation with the NMOS transistor's behavior under high current/voltage conditions (i.e., behavior under ESD conditions). SPICE macros, such as illustrated by the exemplary SPICE macro in Table 2, may be implemented for various circuit elements whose ESD behavior is desired, as discussed above, to simulate circuit element or circuit behavior under ESD conditions.

Figure 13:
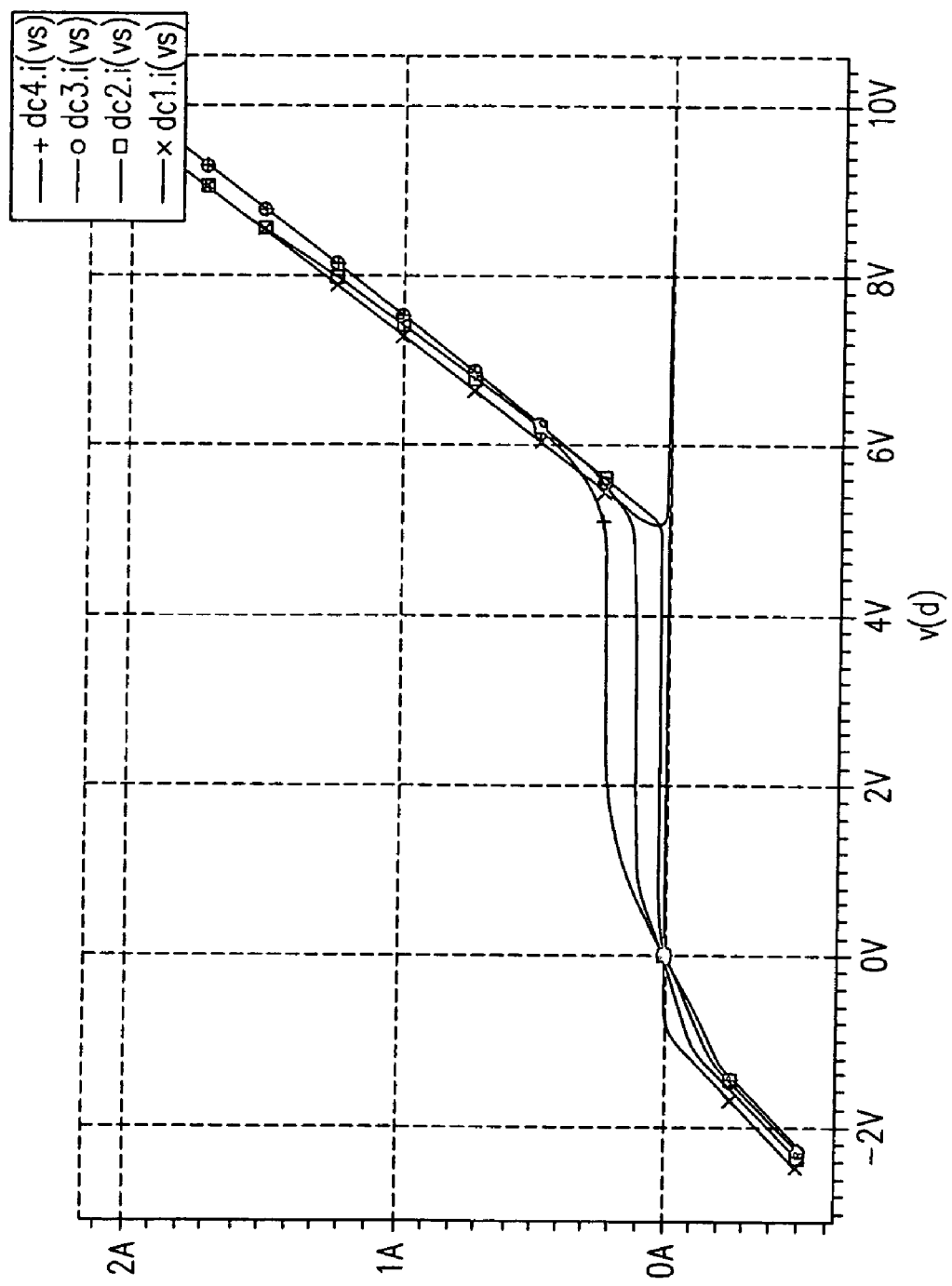
FIG. 13 shows an exemplary simulation plot of current versus voltage for an electrical component in accordance with an embodiment of the present invention.

FIG. 13 shows an exemplary SPICE simulation plot of current versus voltage for an NMOS transistor in accordance with an embodiment of the present invention. In the SPICE simulation plot, a drain terminal voltage and current are plotted along an x-axis and a y-axis, respectively. The four plotted curves (labeled dc1 through dc4) correspond to a gate terminal bias voltage which varies from 0 to 1.5 volts, respectively, in 0.5 volt steps.

TABLE 2

```
.macro no5esd d g s b w=20 l=0.34 m=36
    .param
    +    sabl=0.8
    +    sabo=0.5
    +    sabg=0.56
    +    dcsb=0.56
    +    scg=1
    +    ct='0.12/2'
*   +    wintf2en=1.3e-7
    +    dw='2*wintf2en*1e6'
    .param
    +    rshsd=6
    +    drsab=0
    +    rshsab='400+drsab'
    +    nrd='sabg/(w-dw)+(dcsb+ct)/(w-dw-2*sabo)'
    +    nrs='(scg+ct)/(w-dw)'
    +    rsab1='rshsab*sabl/(w-dw-2*sabo)'
    +    rsab2='rshsab*(sabl+sabg+ct)/(2*sabo)'
    +    rsab='1/(1/rsab1+1/rsab2)'
    +    rcont='0.3*w*m/20'
    +    resd='rshsd*nrd*rsab+rcont'
    +    ress='rshsd*nrs+rcont'
rd d ndx resd
rs s nsx ress
ddesd1 bb ndx desdu w='w-dw' l='sabl'
ddesd2 bb ndx desdu w='2*sabo' l='dcsb+ct'
ddesd3 bb ndx desds w='w-dw-2*sabo' l='dcsb+ct'
mx1 dd g ss bb nicore w=w l=l geo=3
+ ad='sabg*(w-dw)'
+ as='(scg+ct)*(w-dw)'
+ pd='2*sabg+2*sabl+2*(dcsb+ct)'
+ ps='2*(dcsb+ct)+(w-dw)'
rsub bb b '5*pwr(720*0.34/(m*w*l),2)'
rbase bb nbx '600*pwr(720*0.34/(m*w*l),2)'
.param CJSW    =1.53e−10
.param CJB     ='CJSW*w*1e-6'
.param BETA    ='3*pwr((0.34/l),0)'
.param TRST    ='3.2*l*l/4*1e-9'
.model npnb npn geom=−1
    +       area='w*0.1'
    +       areac='w*0.1'
    +       areab='w*l'
    +       tf=TRST tr=TRST cje=CJB cjc=CJB
    +       bf=BETA br=BETA
qbase ncx nbx nex npnb
vmd ndx dd
vmc ndx ncx
vms nsx ss
vme nsx nex
.param LEc    ='l*l'
.param k1     =0.04
.param k2     ='4*pwr((0.34/l),1.8)'
.param d1     ='5.6*pwr((w*m/720),0.23)'
.param d2     ='5.9*pwr((l/0.34),0.5)'
.param vt     =0.5
avdsatc ac 0 v  =IF (v(g)-v(ss)) LE vt THEN 0.0
       + ELSE    (v(g)-v(ss)-vt)/(1+(v(g)-v(ss)-vt)/LEc)
avdsate ae 0 v  =IF (v(g)-v(dd)) LE vt THEN 0.0
       + ELSE    (v(g)-v(dd)-vt)/(1+(v(g)-v(dd)-vt)/LEc)
amvds ad 0 v    =v(dd)-v(ss)
***** Igen(C) *****
amvdp a1 0 v    =IF v(ad) LE v(ac) THEN 0.0
       + ELSE    v(ad)-v(ac)
amcx amc 0 v    =IF v(a1) LE d1 THEN 1+exp(k2*(v(a1)-d2))
       + ELSE    exp(k1*(v(a1)-d1)) + exp(k2*(v(a1)-d2))
Eamc1 jc 0 vol='-(v(amc)-1)/m'
Ramc1 jc 0 1
FIgc ndx nbx poly(3) Eamc1 vmd vmc 0 0 0 0 1 1
***** Igen(E) *****
amvsp a2 0 v    =IF -v(ad) LE v(ae) THEN 0.0
       + ELSE    -v(ad)-v(ae)
amex ame 0 v    =IF v(a2) LE d1 THEN 1+exp(k2*(v(a2)-d2))
       + ELSE    exp(k1*(v(a2)-d1)) + exp(k2*(v(a2)-d2))
Eame1 je 0 vol='-(v(ame)-1)/m'
Rame1 je 0 1
FIge nsx nbx poly(3) Eame1 vms vme 0 0 0 0 1 1
.eom
```

In accordance with one or more embodiments of the present invention, techniques are disclosed which provide for the measurement and characterization of physical electrical components (e.g., transistors and diodes) at high voltages and currents over a very short time domain to extract generalized parameters representing their behavior. The desired electrical components are then incorporated into a circuit schematic and the circuit schematic read into a circuit simulator, such as for example SPICE, along with their generalized parameters (e.g., in the form of associated macros that define the behavior of the electrical components under ESD conditions). A stimulus corresponding to an ESD event is applied to the simulated circuit and resultant voltages and currents are monitored and compared against failure criteria (e.g., a table of failure criteria determined for the electrical components). By varying the level of ESD input stimulus and checking for destructive failure of the simulated circuit based on the failure criteria, a value of ESD immunity (i.e., ESD protection) is obtained for the circuit.

Embodiments described above illustrate but do not limit the invention. It should also be understood that numerous modifications and variations are possible in accordance with the principles of the present invention. Accordingly, the scope of the invention is defined only by the following claims.

We claim:

1. A method of determining an electrostatic discharge protection for a circuit, the method comprising:
   entering the circuit into a circuit simulation program;
   representing a circuit element of the circuit in the circuit simulation program by its behavior under electrostatic discharge conditions based on testing of a physical form of the circuit element to determine its behavior and a failure criteria under electrostatic discharge conditions;
   running the circuit simulation program to obtain simulation results, wherein the circuit simulation program provides an electrostatic discharge stimulus to the circuit; and
   comparing the simulation results to a failure criteria for the circuit.

2. The method of claim 1, further comprising testing the physical form of the circuit element to determine its behavior and the failure criteria under electrostatic discharge conditions.

3. The method of claim 2, wherein the testing comprises applying transmission line pulses to the physical circuit element to determine current and voltage behavior of the circuit element.

4. The method of claim 2, wherein various parameters of the physical circuit element are varied during the testing to form a generalized behavior model of the circuit element.

5. The method of claim 2, wherein various parameters of the physical circuit element are varied during the testing to form a macro for the representing of the circuit element.

6. The method of claim 1, wherein the circuit simulation program comprises a SPICE circuit simulation program.

7. The method of claim 1, wherein the electrostatic discharge stimulus comprises a charge device model or a human body model.

8. The method of claim 1, further comprising determining a performance of the circuit for its intended function based on results of the circuit simulation program.

9. A computer readable medium storing a circuit simulation program comprising:
   symbols for representing a behavior of corresponding circuit elements under normal operating conditions; and
   symbols for representing a behavior of the corresponding circuit elements under electrostatic discharge conditions, which correspond to macros which provide a general behavior of the corresponding circuit elements based on electrostatic discharge testing of the circuit elements.

10. The computer readable medium of claim 9, wherein the circuit simulation program further comprises a circuit model for providing electrostatic discharge input signals to a simulated circuit.

11. The computer readable medium of claim 10, wherein the circuit model comprises a charge device circuit model and/or a human body circuit model.

12. A method of testing a circuit for an electrostatic discharge protection, the method comprising:
    providing a circuit simulation program to simulate the circuit; and
    providing macros within the circuit simulation program which represent a behavior of corresponding circuit elements under electrostatic discharge conditions.

13. The method of claim 12, further comprising providing an electrostatic discharge circuit model within the circuit simulation program to simulate an electrostatic discharge applied to the circuit.

14. The method of claim 13, wherein the electrostatic discharge circuit model comprises a charge device circuit model or a human body circuit model.

15. The method of claim 12, wherein the circuit simulation program is operable to simulate the circuit under electrostatic discharge conditions.

16. The method of claim 12, wherein the circuit simulation program is operable to simulate the circuit under electrostatic discharge conditions and compare simulation results to failure criteria.

17. The method of claim 12, wherein the circuit simulation program is operable to simulate the circuit under electrostatic discharge conditions to generate simulation results for comparison to failure criteria.

18. The method of claim 12, wherein the macros are based on test results of the corresponding circuit elements under electrostatic discharge conditions.

19. The method of claim 12, wherein the circuit simulation program comprises a SPICE circuit simulation program.

20. A method of generating circuit element macros for simulating an electrostatic discharge behavior, the method comprising:
    testing a physical circuit element to determine its behavior and a failure criteria under electrostatic discharge conditions; and
    creating an associated macro for the physical circuit element representing the determined electrostatic discharge behavior, the macro suitable for use in a circuit simulation program.

21. The method of claim 20, wherein the testing operation further comprises varying parameters of the physical circuit element to generalize the determined electrostatic discharge behavior for the physical circuit element.

22. The method of claim 20, wherein the circuit simulation program comprises a SPICE circuit simulation program.

* * * * *